(12) United States Patent
Jeong

(10) Patent No.: US 8,045,342 B2
(45) Date of Patent: Oct. 25, 2011

(54) PLASMA DISPLAY DEVICE

(75) Inventor: Kwang-Jin Jeong, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 474 days.

(21) Appl. No.: 12/263,366

(22) Filed: Oct. 31, 2008

(65) Prior Publication Data

US 2009/0135577 A1    May 28, 2009

(30) Foreign Application Priority Data

Nov. 26, 2007    (KR) .................. 10-2007-0120985

(51) Int. Cl.
*H05K 9/00*    (2006.01)
(52) U.S. Cl. ....................................... 361/816
(58) Field of Classification Search .................. 361/816
See application file for complete search history.

(56) References Cited

U.S. PATENT DOCUMENTS

| | | | | |
|---|---|---|---|---|
| 5,971,566 A * | 10/1999 | Tani et al. | ...................... | 362/294 |
| 6,348,653 B1 * | 2/2002 | Cho | ............... | 174/383 |
| 6,560,124 B1 * | 5/2003 | Irie et al. | ........................ | 361/816 |
| 7,034,220 B2 * | 4/2006 | Kim et al. | ...................... | 361/816 |
| 7,411,796 B2 * | 8/2008 | Lee et al. | ....................... | 361/807 |
| 7,477,328 B2 * | 1/2009 | Maruta | ......................... | 348/797 |
| 7,609,531 B2 * | 10/2009 | Xia et al. | ........................ | 361/816 |
| 7,898,506 B2 * | 3/2011 | Fukui | ............................ | 345/60 |
| 2005/0099106 A1 * | 5/2005 | Kim et al. | ........................ | 313/46 |
| 2005/0243106 A1 * | 11/2005 | Bae et al. | ....................... | 345/679 |
| 2007/0236874 A1 * | 10/2007 | Jeong | ............................. | 361/681 |
| 2007/0258199 A1 * | 11/2007 | Jeong | ............................. | 361/681 |
| 2008/0285222 A1 * | 11/2008 | Yeo et al. | ....................... | 361/681 |

FOREIGN PATENT DOCUMENTS

| | | |
|---|---|---|
| CN | 1839418 A | 9/2006 |
| EP | 1659553 A1 | 5/2006 |
| EP | 1783582 A1 | 5/2007 |
| EP | 2063698 A1 * | 5/2009 |
| JP | 63-010597 U | 1/1988 |
| JP | 10-117081 A | 5/1998 |
| JP | 3054017 U | 9/1998 |
| JP | 2000-181373 A | 6/2000 |
| JP | 2003-029643 A | 1/2003 |

(Continued)

OTHER PUBLICATIONS

European Search Report for European Patent Application No. 08169830.0-2214 dated Mar. 10, 2009 by European Patent Office.

*Primary Examiner* — Lisa Lea Edmonds
(74) *Attorney, Agent, or Firm* — Knobbe, Martens, Olson & Bear LLP

(57) ABSTRACT

A plasma display device is disclosed. In one embodiment, the plasma display device includes a plasma display panel (PDP), a chassis base having one side for supporting the PDP, and a printed circuit board assembly (PBA) mounted on another side of the chassis base. The chassis base includes a main frame mounted on the PDP, a bracket mounted on the main frame, a sub-frame mounted on at least one of the main frame, the bracket, and the PDP, and a shield box that is mounted to at least one of the main frame, the bracket, and the sub-frame, and that includes the PBA. One embodiment reduces weight of a chassis base and manufacturing cost, and improves impact resistance of a PDP.

18 Claims, 8 Drawing Sheets

FOREIGN PATENT DOCUMENTS

| | | |
|---|---|---|
| JP | 2005-308794 A | 11/2005 |
| JP | 2006-337982 A | 12/2006 |
| JP | 2007-011352 A | 1/2007 |
| JP | 2007-199705 A | 8/2007 |
| JP | 2009128901 A * | 6/2009 |
| KR | 10-2003-0094494 A | 12/2003 |
| KR | 2004-0011174 A | 2/2004 |
| KR | 2005-0050450 A | 5/2005 |
| KR | 10-2005-0104593 A | 11/2005 |
| KR | 2005-0118956 A | 12/2005 |
| KR | 10-2006-0085458 A | 7/2006 |
| KR | 10-2006-0086218 A | 7/2006 |
| KR | 2006-0094313 A | 8/2006 |
| KR | 10-2007-0000590 A | 1/2007 |
| WO | WO 2007/074847 A1 | 7/2007 |

* cited by examiner

PLASMA DISPLAY DEVICE

CROSS-REFERENCE TO RELATED APPLICATION

This application claims priority to and the benefit of Korean Patent Application No. 10-2007-0120985 filed in the Korean Intellectual Property Office on Nov. 26, 2007, the entire content of which is incorporated herein by reference.

BACKGROUND OF THE INVENTION (a) Field of the Invention

The present invention relates to a plasma display device. More particularly, the present invention relates to a plasma display device for reducing the weight of a chassis base and efficiently shielding electromagnetic interference.

(b) Description of the Related Technology

A plasma display device displays an image on a plasma display panel (PDP), and includes the PDP, a chassis base, and a printed circuit board assembly (PBA).

The PDP is provided on a front surface of the chassis base, and the PBA is provided on a rear surface thereof. The chassis base increases mechanical strength of the PDP, provides a space for mounting the PBA, functions as a heat sink of the PDP, and protects against electromagnetic interference (EMI).

Conventionally, the chassis base is formed as a metal plate. Accordingly, the chassis base increases the weight of the plasma display device and manufacturing cost thereof.

As the weight of the plasma display device increases, impact resistance of the PDP deteriorates.

The PBA is provided on the chassis base while both surfaces are substantially exposed (e.g., not covered). Since both surfaces of the PBA are exposed, it is generally desirable to additionally provide a shield member for shielding the EMI generated from the PBA.

The EMI shield member increases the manufacturing cost and the weight of the plasma display device, and negatively affects the impact resistance of the PDP.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect of the present invention provides a plasma display device for reducing weight of a chassis base and manufacturing cost, and improving impact resistance of a plasma display panel (PDP).

Another aspect of the present invention provides a plasma display device for efficiently shielding electromagnetic interference (EMI) generated from a printed circuit board assembly (PBA).

Another aspect of the present invention provides a plasma display device which includes the PDP, the chassis base having one side for supporting the PDP, and a printed circuit board assembly (PBA) mounted on the other side of the chassis base. The chassis base may include a main frame mounted on the PDP, a bracket mounted on the main frame, a sub-frame mounted on at least one of the main frame, the bracket, and the PDP, and a shield box that is mounted to at least one of the main frame, the bracket, and the sub-frame, and that includes the PBA.

The PDP may include a pair of longer sides including first and second longer sides and a pair of shorter sides including first and second shorter sides, and the main frame may include a first main frame mounted on the first longer side of the PDP and a second main frame separated from the first main frame to be mounted on the second longer side of the PDP.

The first and second main frames may be disposed in parallel.

The bracket may connect the first main frame to the second main frame.

The bracket may include a first bracket and a second bracket separated from each other by a predetermined interval to connect the first main frame and the second main frame.

The first and second brackets may be disposed in parallel.

The bracket may be apart from the first and second main frames toward an opposite side of the PDP by a predetermined height.

The sub-frame may be connected to one of the first main frame and the second main frame, and one of the first bracket and the second bracket.

A width of the sub-frame may be less than a width of the main frame.

The shield box may include a plate member at least mounted on the sub-frame, and a cover mounted on the plate member by using a fastening member while covering the PBA mounted on the plate member.

The plate member may be formed of at least one of a metallic material and a material including carbon.

The cover may be physically and electrically connected to the plate member.

The cover may include an elastic portion formed at a location where the cover touches the plate member.

The shield box may include a cover mounted on the sub-frame by using a fastening member through the PBA while covering the PBA mounted on the sub-frame.

Another aspect of the present invention provides a plasma display device which may include a plasma display panel (PDP) including a pair of longer sides and a pair of shorter sides, first and second main frames respectively mounted on the pair of longer sides of a rear surface of the PDP, first and second brackets having a predetermined interval therebetween to connect the first main frame to the second main frame, a sub-frame mounted to at least two of the first main frame, the second main frame, the first bracket, and the second bracket, a shield box mounted on at least two of the first main frame, the second main frame, and the sub-frame, and a printed circuit board assembly mounted in the shield box.

The shield box may include a plate member mounted to at least two of the first main frame, the second main frame, and the sub-frame, and a cover mounted on the plate member by using a fastening member. Another aspect of the invention provides a plasma display device comprising: i) a plasma display panel (PDP), ii) a chassis base configured to support the PDP via one surface and iii) a printed circuit board assembly (PBA) mounted on another opposing surface of the chassis base, wherein the chassis base comprises a main frame mounted on the PDP, a bracket mounted on the main frame, a sub-frame mounted on at least one of the main frame, the bracket, and the PDP, and a shield box mounted to at least one of the main frame, the bracket, and the sub-frame, wherein the shield box is configured to at least partially cover the PBA.

In the plasma display device, the PDP may comprise first and second longer sides and first and second shorter sides, and wherein the main frame may comprise a first main frame mounted on the first longer side of the PDP and a second main frame separated from the first main frame mounted on the second longer side of the PDP.

In the plasma display device, the first and second main frames may be disposed generally in parallel to each other. In the plasma display device, the bracket may interconnect the first main frame and the second main frame.

In the plasma display device, the bracket may comprise a first bracket and a second bracket spaced apart from each other, and wherein each of the first and second brackets may be configured to interconnect the first main frame and the second main frame.

In the plasma display device, the first and second brackets may be disposed generally in parallel to each other. In the plasma display device, at least one of the first and second bracket may be generally perpendicular to at least one of the first and second main frames.

In the plasma display device, the bracket may be farther from the PDP than the first and second main frames. In the plasma display device, the sub-frame may be connected to i) one of the first main frame and the second main frame, and ii) one of the first bracket and the second bracket. In the plasma display device, the width of the sub-frame may be less than the width of the main frame.

In the plasma display device, the shield box may comprise: a plate member mounted on at least one of the sub-frame and main frame and a cover mounted on the plate member via a fastening member, wherein the cover is configured to cover the PBA mounted on the plate member.

In the plasma display device, the plate member may be formed of at least one of a metallic material and a material including carbon. In the plasma display device, the cover is physically and electrically connected to the plate member. In the plasma display device, the cover may comprise an elastic portion formed at a location where the cover contacts the plate member. In the plasma display device, the shield box may comprise a cover mounted on the sub-frame via a fastening member, and wherein the cover is configured to cover the PBA mounted on the sub-frame.

Another aspect of the invention provides a plasma display device comprising: i) a plasma display panel (PDP) comprising first and second opposing surfaces, wherein the first surface is configured to display an image, and wherein the second surface comprises a pair of longer sides and a pair of shorter sides, ii) first and second main frames respectively mounted on the pair of longer sides of the second surface of the PDP, iii) first and second brackets spaced apart from each other, wherein each of the first and second brackets is configured to interconnect the first main frame and the second main frame, iv) a sub-frame mounted to at least two of the first main frame, the second main frame, the first bracket, and the second bracket, v) a shield box mounted on at least two of the first main frame, the second main frame, and the sub-frame and vi) a printed circuit board assembly at least partially covered by the shield box.

In the plasma display device, the shield box may comprise: a plate member mounted to at least two of the first main frame, the second main frame, and the sub-frame and a cover mounted on the plate member and configured to at least partially cover the printed circuit board assembly in conjunction with the plate member.

Still another aspect of the invention provides a plasma display device comprising: i) a plasma display panel (PDP) and ii) a chassis base configured to support the PDP, wherein the chassis base comprises: a plurality of main components spaced apart from each other and each main component mounted to a different portion of the PDP, respectively and a connection structure interconnecting the plurality of main components so as to provide a support for the PDP.

In the plasma display device, the plurality of main components may comprise two components which are mounted on the PDP and generally parallel to each other. In the plasma display device, the connection structure may comprise: a bracket configured to interconnect at least two of the plurality of main components and a sub-component mounted on at least one of the main components, the bracket, and the PDP, wherein the width of the sub-component is less than that of at least one of the plurality of main components.

DETAILED DESCRIPTION OF CERTAIN INVENTIVE EMBODIMENTS

Figure 1:
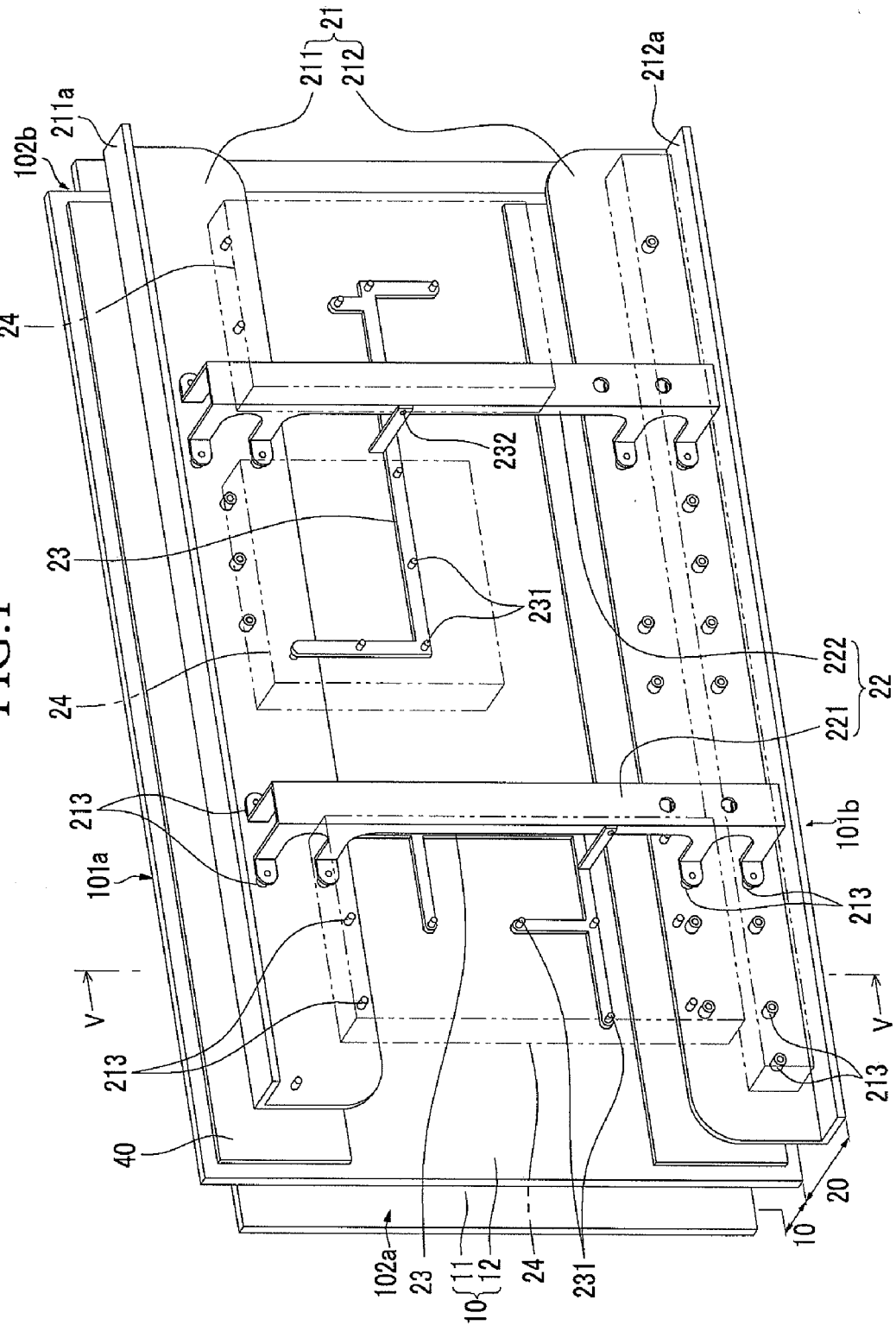
FIG. 1 is an exploded perspective view of a plasma display device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

FIG. 1 is an exploded perspective view of a plasma display device according to an exemplary embodiment of the present invention.

Figure 5:
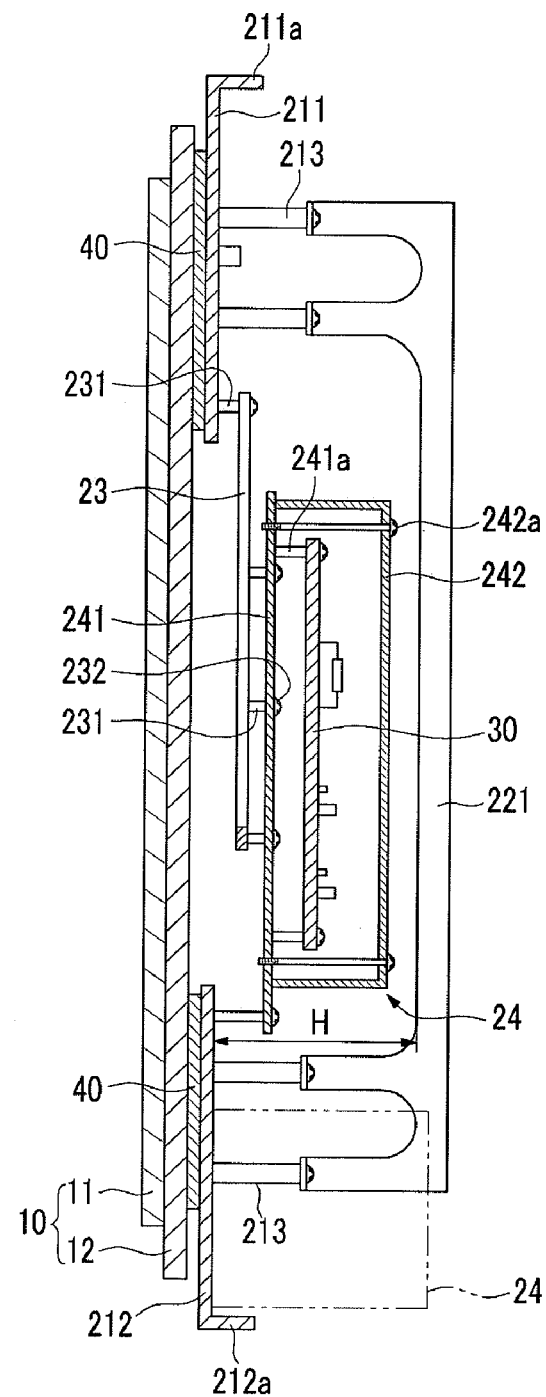
FIG. 5 is a cross-sectional view taken along a line of V-V shown in FIG. 1.
Figure 6:
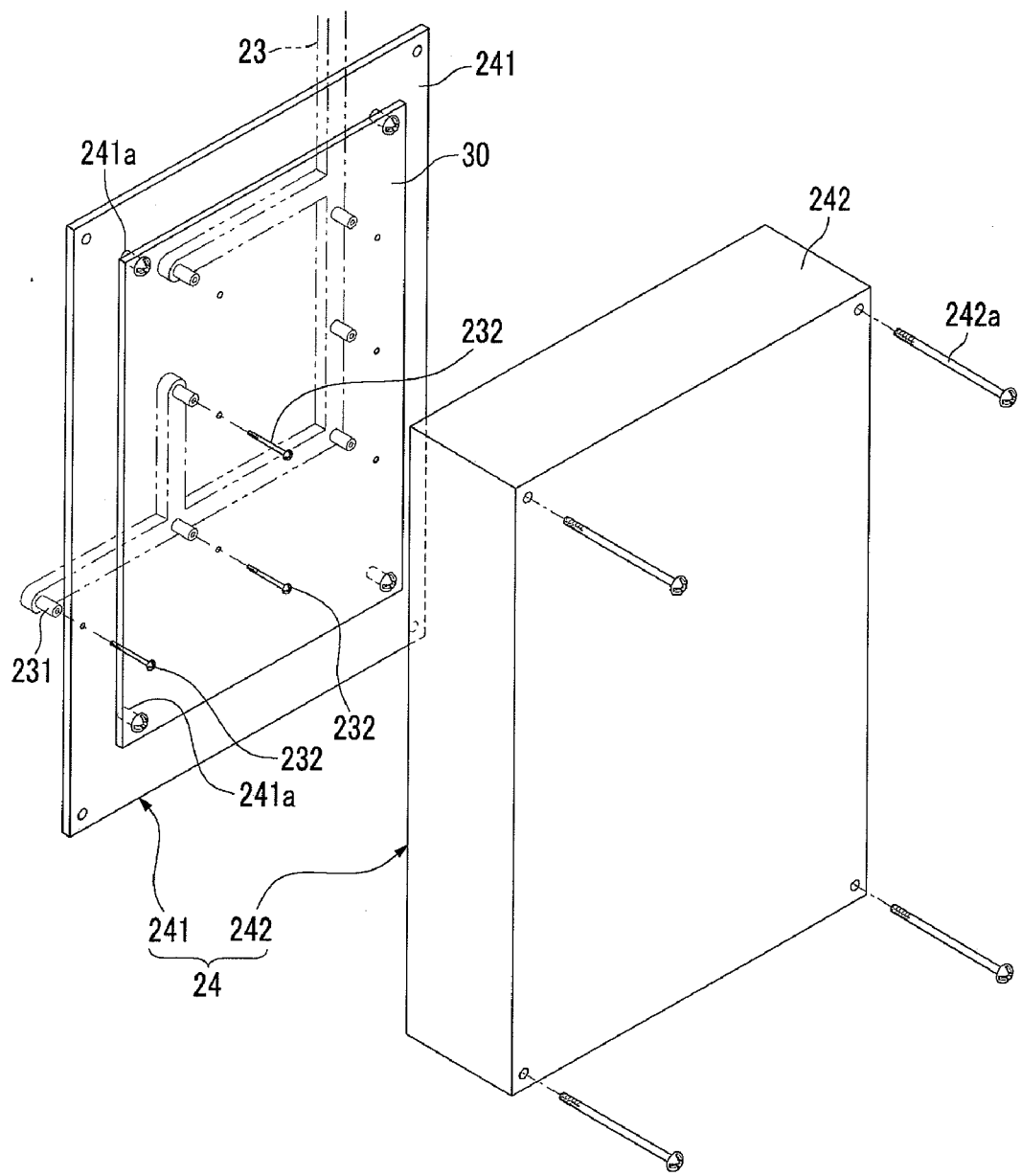
FIG. 6 is an exploded perspective view of a shield box according to a first exemplary embodiment of the present invention.

Referring to FIG. 1, the plasma display device includes a plasma display panel (PDP) 10, a chassis base 20, and a printed circuit board assembly (PBA) 30 shown in FIG. 5 and FIG. 6.

The PDP 10 includes a front substrate 11 and a rear substrate 12, and displays an image by using gas discharge. A configuration and functions of the PDP 10 have been disclosed.

The exemplary embodiment of the present invention relates to the chassis base 20 for supporting the PDP 10 and combining relationships between elements for forming the chassis base 20. Therefore, detailed descriptions of constituent elements of the PDP 10 will be omitted.

A double-sided adhesive tape 40 is provided to attach the chassis base 20 on the rear surface of the PDP 10 to support the PDP 10. As an example, the chassis base 20 is partially overlapped with the rear surface of the PDP 10.

The weight of the chassis base 20 is reduced and the manufacturing cost is reduced compared to a typical single piece chassis base as the area and weight of the chassis base 20 is less than those of the single piece chassis base.

A plurality of PBAs 30 are provided on the chassis base 20 at a side opposite to that of the PDP 10. The PBA 30 includes a sustain electrode driving board for controlling a sustain electrode (not shown), a scan electrode driving board for controlling a scan electrode (not shown), and an address buffer board for controlling an address electrode (not shown).

The PBA 30 may further include a logic board and a power supply board. The logic board externally receives a video signal, and generates control signals for driving the address electrode, the sustain electrode, and the scan electrode. The power supply board supplies a power source for driving the PBAs 30. For convenience of description, the respective boards are commonly referred to as the PBA 30 when described in the exemplary embodiment of the present invention.

The chassis base 20 includes a main frame (or main component) 21, a bracket 22, a sub-frame (or sub-component) 23, and a shield box 24. The PDP 10 is attached to a front surface of the main frame 21, and the PBA 30 is mounted on a rear surface of the main frame 21. The PDP 10 includes a pair of longer sides 101a and 101b and a pair of shorter sides 102a and 102b that form a quadrangle.

The main frame 21 has a predetermined width so as to stably support the PDP 10, and is attached to the longer sides 101a and 101b of the rear surface of the PDP 10. The main frame 21 may be attached to the shorter sides 102. The attachment area of the PDP 10 and the main frame 21 may be increased when the main frame 21 is attached to the longer side longer sides 101a and 101b. Therefore, the PDP 10 and the main frame 21 are maintained to be tightly combined. In another embodiment, more than two main frames may be provided either on the longer sides or shorter sides. Such main frames may be substantially the same in size as each other, and may be generally parallel to each other. The content of this paragraph applies to the remaining embodiments As an example, the main frame 21 includes a first main frame 211 and a second main frame 212. The first main frame 211 is attached to a first longer side 101a of the PDP 10 to support the first longer side 101a of the PDP 10.

The second main frame 212 is separated from the first main frame 211 by a predetermined interval to be attached to a second longer side 101b of the PDP 10 and supports the second longer side 101b of the PDP 10.

Therefore, the first main frame 211 and the second main frame 212 may be respectively attached to the first longer side 101a and the second longer side 101b of the PDP 10, and may evenly support the PDP 10.

The first main frame 211 and the second main frame 212 are arranged generally in parallel to each other, and may substantially evenly support the PDP 10 while the first main frame 211 and the second main frame 212 are separated from each other.

Figure 2:
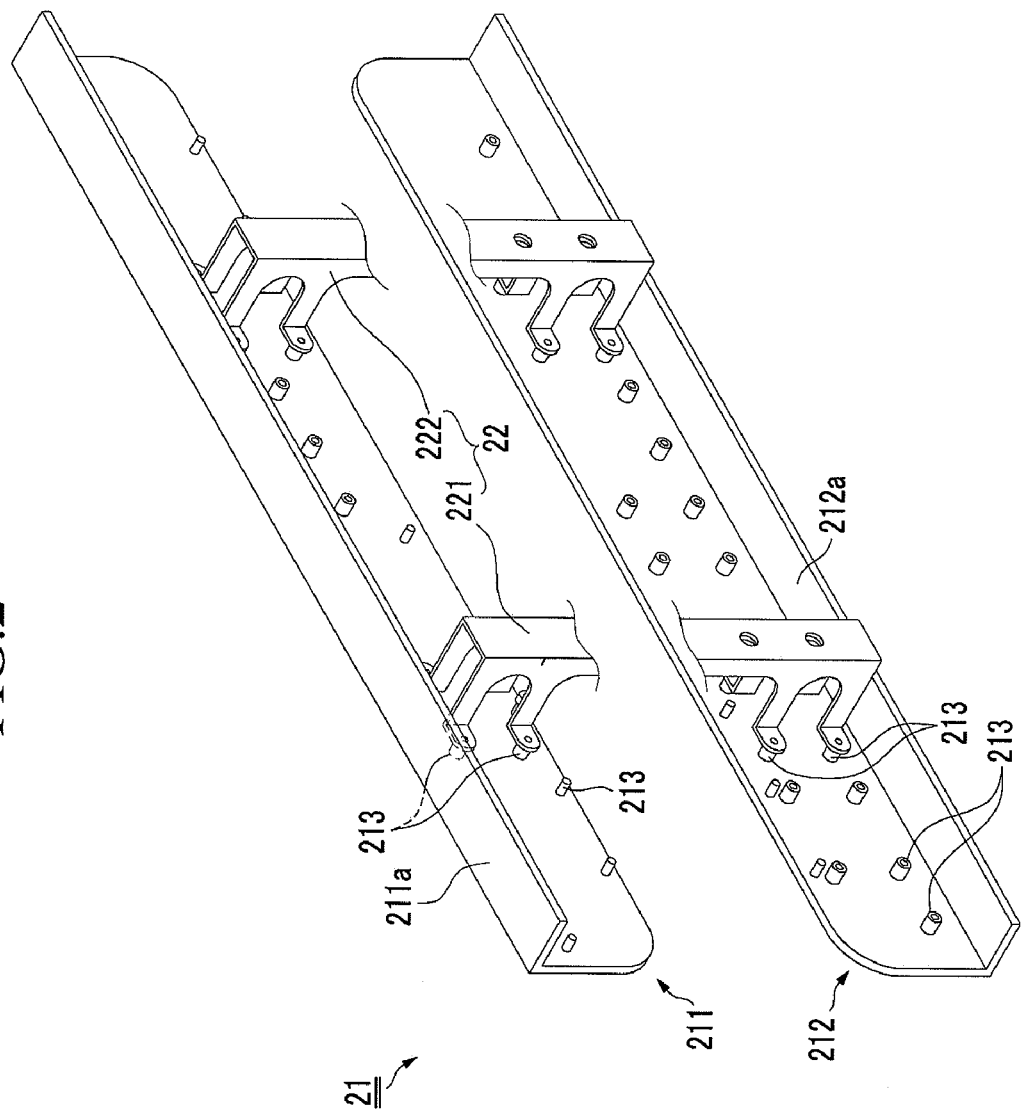
FIG. 2 is a perspective view of the main frame.

FIG. 2 is a perspective view of the main frame.

Referring to FIG. 2, the first main frame 211 and the second main frame 212 respectively include a plurality of bosses 213. The bosses 213 are mounting positions of the bracket 22, the sub-frame 23, and the shield box 24.

The first main frame 211 and the second main frame 212 may be substantially, in shape and position, symmetrical to each other. Since the bosses 213 are provided where they are needed, the bosses 213 may be arranged to be asymmetrical or symmetrical.

The first main frame 211 and the second main frame 212 are formed of, for example, a metallic material, and respectively include a first bent portion 211a and a second bent portion 212a to increase structural strength against bending. In another embodiment, the bent portions 211a and 212a may be omitted.

Figure 3:
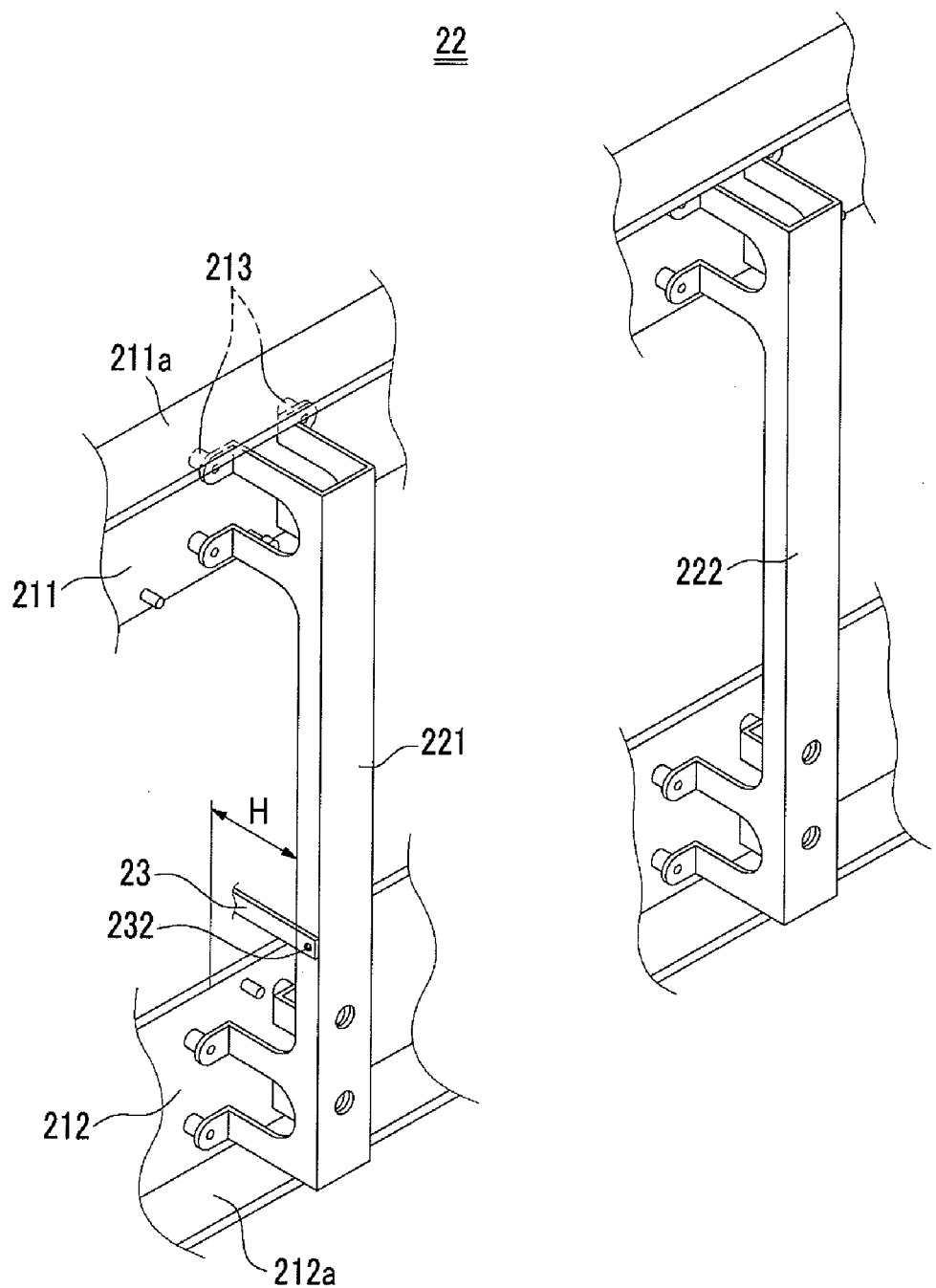
FIG. 3 is a perspective view of the bracket.

FIG. 3 is a perspective view of the bracket 22.

Referring to FIG. 3, the bracket 22 is mounted on the main frame 21. In further detail, the bracket 22 is combined to the bosses 213 of the first main frame 211 and the second main frame 212 to integrally connect the first main frame 211 and the second main frame 212.

The first main frame 211 and the second main frame 212 may be arranged generally in parallel with the longer sides 101a and 101b, and the bracket 22 is arranged in parallel with the shorter sides 102a and 102b. That is, the bracket 22 is disposed in a direction generally perpendicular to the first main frame 211 and the second main frame 212 to connect the first main frame 211 and the second main frame 212.

One bracket 22 may be formed, or a plurality of brackets 22 may be formed to stably connect the first main frame 211 and the second main frame 212.

As an example, the bracket 22 includes a first bracket 221 and a second bracket 222 that are disposed with a predetermined interval therebetween. In this case, the first bracket 221 and the second bracket 222 are disposed generally in parallel to stably connect the first main frame 211 and the second main frame 212.

The bracket 22 (i.e., the first bracket 221 and the second bracket 222) is spaced apart from the first main frame 211 and the second main frame 212 in a direction opposite to the PDP 10 by a predetermined height H (see FIG. 3 or 5). Due to the height H of the bracket 22, an external stand (not shown) can be connected to the plasma display device, and the PBA 30 is provided between the bracket 22 and the PDP 10 (see FIG. 5).

Figure 4:
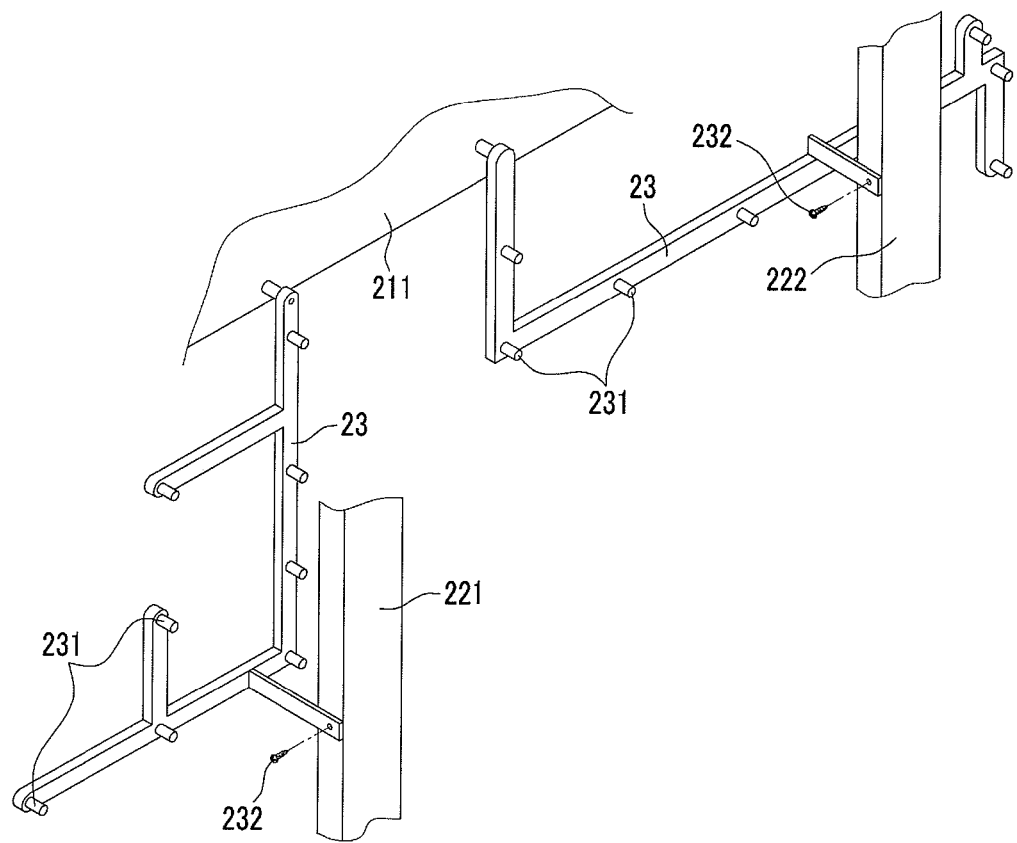
FIG. 4 is a perspective view of the sub-frame.

FIG. 4 is a perspective view of the sub-frame.

Referring to FIG. 4, the sub-frame 23 provides a space for mounting the PBA 30. Therefore, the sub-frame 23 is provided between the first main frame 211 and the second main frame 212. One sub-frame may be formed, or a plurality of sub-frames may be formed. In the exemplary embodiment of the present invention, two separated sub-frames 23 are illustrated.

The sub-frame 23 is used to provide a space for stably mounting the PBA 30, and it may be mounted on the main frame 21, the bracket 22, or the PDP 10.

One end of each sub-frame 23 is connected to the main frame 21 (e.g., the first main frame 211), and the other end of the respective sub-frames 23 is connected to the bracket 22 (e.g., the first or second bracket 221 or 222).

The sub-frame 23 includes a plurality of bosses 231. The bosses 231 are mounting positions of the PBA 30 and the shield box 24. That is, the PBA 30 may be directly or indirectly connected to the bosses 231 of the sub-frame 23. The shield box 24 including the PBA 30 may be connected to the bosses 231.

One end of the sub-frame 23 is connected to the boss 231 of the main frame 21 (e.g., the first main frame 211), and the other end is connected to the bracket 22 (e.g., the first bracket 221) by using a setscrew 232.

The shape of the sub-frame 23 is variously formed to be connected to the first bracket 221 while being connected to the first main frame 211 (or the second main frame 212). In this case, the chassis base 20 has a strong fastening force. That is, free ends of the first main frame 211 (or the second main frame 212), the first bracket 221, the second bracket 222, and the sub-frame 23 are reduced so as to have strong mechanical strength.

In one embodiment, a width of the sub-frame 23 is less than a width of the main frame 21. Substantially, the mechanical strength of the chassis base 20 is sufficiently formed by the first main frame 211, the second main frame 212, the first bracket 221, and the second bracket 222. Therefore, the sub-frame 23 may have mechanical strength only for supporting the PBA 30 and the shield box 24.

FIG. 5 is a cross-sectional view taken along a line of V-V shown in FIG. 1, and FIG. 6 is an exploded perspective view of a shield box according to a first exemplary embodiment of the present invention.

Referring to FIG. 5 and FIG. 6, the shield box 24 is formed to shield the EMI generated from the PBA 30. The shield box 24 is formed as a generally rectangular parallelepiped or as a generally rectangular parallelepiped having one open surface.

In the present embodiment, the shield box 24 encloses the PBA 30, and is selectively mounted on the main frame 21, the bracket 22, and the sub-frame 23. However, the present invention is not limited thereto, and thus the shield box 24 may partially cover the PBA 30. When the shield box 24 is mounted on more than one of the main frame 21, the bracket 22, and the sub-frame 23, the mechanical strength of the chassis base 20 is further increased.

Referring to FIG. 5, the shield box 24 is connected to the sub-frame 23 and the second main frame 212, and the first main frame 211 and the second main frame 212 are connected to each other by the sub-frame 23 and the shielding box 24. The shield box 24 shields the EMI, and increases the mechanical strength of the chassis base 20.

The shield box 24 includes a plate member 241 and a cover 242 that are connected to each other, so that the EMI generated from the PBA 30 may be efficiently shielded.

The plate member 241 is connected to the boss 231 of the sub-frame 23. The PBA 30 is connected to a boss 241a formed on the plate member 241. The cover 242 is combined to the plate member 241 by a fastening member 242a while covering the PBA 30.

The EMI generated from the PBA 30 is grounded through the cover 242 and the plate member 241, is subsequently grounded to the first main frame 211 through the boss 231 and the sub-frame 23, and is grounded from the plate member 241 to the second main frame 212 through the boss 231.

The plate member 241 may include a metallic material having electrical conductivity or a material including carbon (e.g., E-GRAF®) so as to ground the EMI. In addition, the cover 242 is physically and electrically connected to the plate member 241, and it may be formed of a metallic material to shield the EMI.

A configuration and a function of a shield box according to second and third exemplary embodiments is similar to those of the first exemplary embodiment of the present invention, and therefore descriptions of parts having been described will be omitted.

Figure 7:
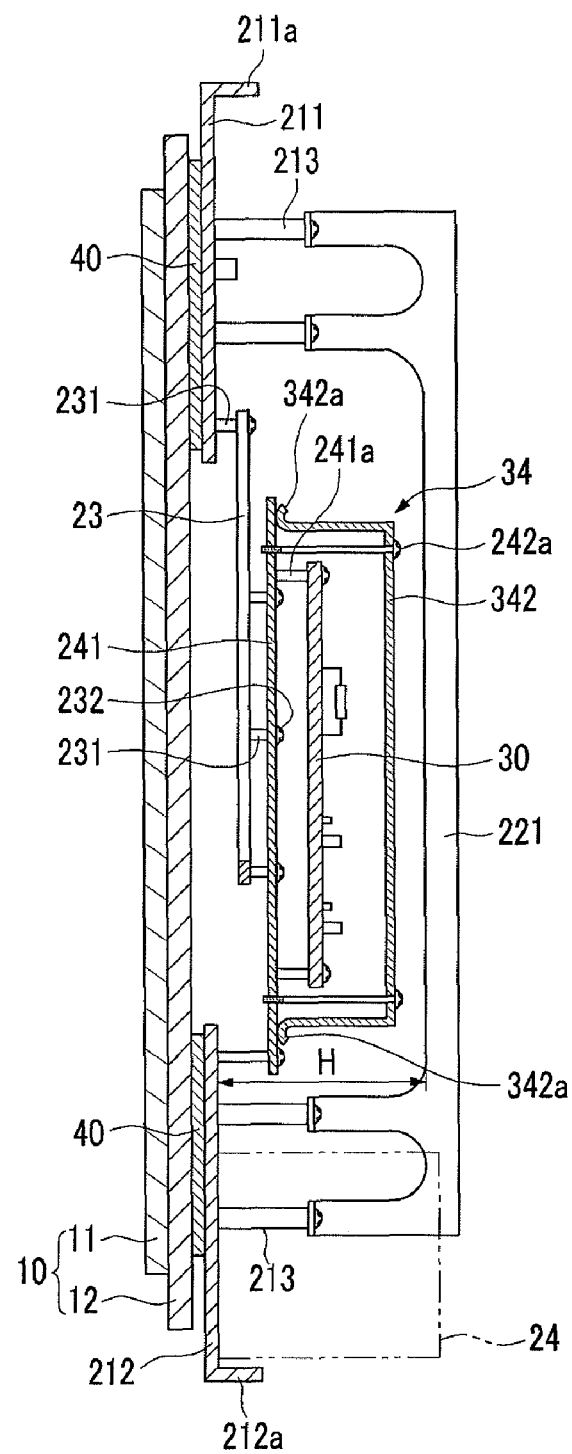
FIG. 7 is a cross-sectional view of a shield box according to the second exemplary embodiment of the present invention.

FIG. 7 is a cross-sectional view of a shield box according to the second exemplary embodiment of the present invention.

Referring to FIG. 7, in a shield box 34, a cover 342 includes an elastic portion 342a formed to face the plate member 241. Since the elastic portion 342a has an elastic force at an end of the cover 342 in a direction toward the plate member 241, the cover 342 and the plate member 241 are tightly combined.

Therefore, the EMI shielded by the cover 342 may be further efficiently grounded to the plate member 241 through the elastic portion 342a.

Figure 8:
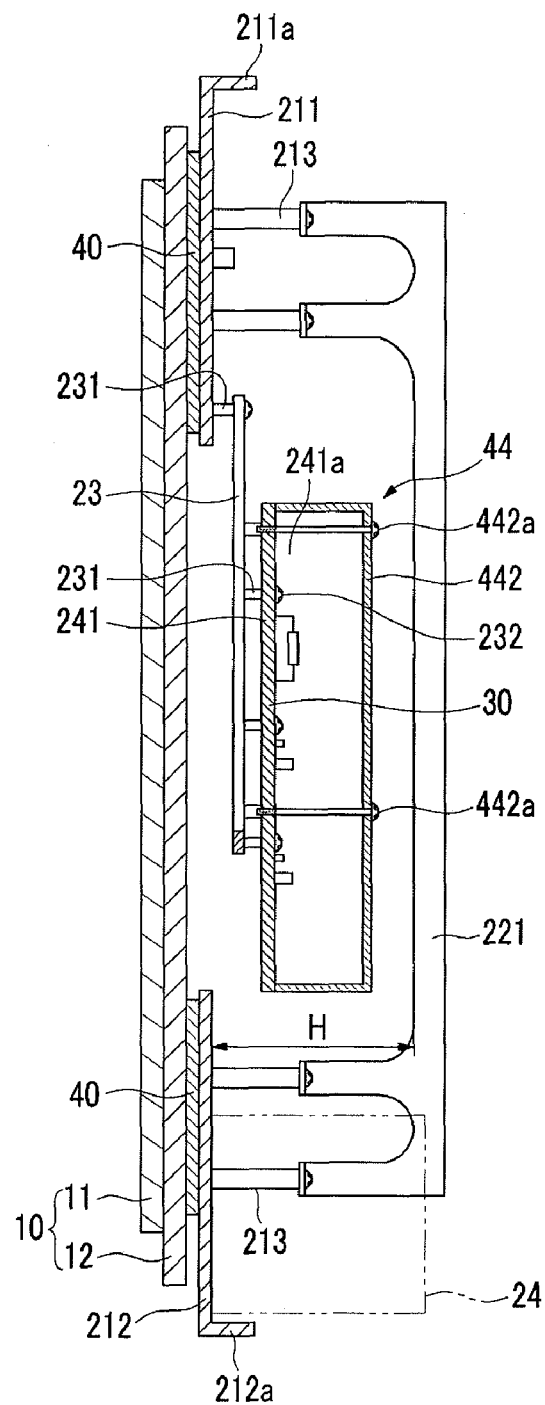
FIG. 8 is a cross-sectional view of a shield box according to a third exemplary embodiment of the present invention.

FIG. 8 is a cross-sectional view of a shield box according to a third exemplary embodiment of the present invention.

Referring to FIG. 8, one surface of a shield box 44 is the PBA 30, and a cover 442 shields the remaining five surfaces. That is, the PBA 30 is connected to the sub-frame 23, and the cover 442 is connected to the sub-frame 23 through the PBA 30 by using a fastening member 442a. In addition, the cover 442 may be close to a ground pattern (not shown) of the PBA 30.

Therefore, the EMI generated from the PBA 30 is grounded to the sub-frame 23 through the cover 442 and the fastening member 442a, and is grounded from the cover 442 to the boss 231 and sub-frame 23 through the ground pattern of the PBA 30.

In at least one embodiment of the present invention, since the chassis base includes the main frame, the sub-frame, and the bracket, the weight and manufacturing cost may be reduced compared to a chassis base of a plate shape.

Since the weight of the plasma display device is reduced, impact resistance of the PDP increases.

In addition, since the PBA is provided in the shield box and is mounted on the main frame or the sub-frame, the EMI generated from the PBA may be efficiently shielded.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device comprising:
a plasma display panel (PDP);
a chassis base configured to support the PDP via one surface; and
a printed circuit board assembly (PBA) mounted on another opposing surface of the chassis base,
wherein the chassis base comprises
a main frame mounted on the PDP,
a bracket mounted on the main frame,
a sub-frame mounted on at least one of the main frame, the bracket, and the PDP, and
a shield box mounted to at least one of the main frame, the bracket, and the sub-frame, wherein the shield box is configured to at least partially cover the PBA,
wherein the PDP comprises first and second longer sides and first and second shorter sides, and
wherein the main frame comprises a first main frame mounted on the first longer side of the PDP and a second main frame separated from the first main frame mounted on the second longer side of the PDP.

2. The plasma display device of claim 1, wherein the first and second main frames are disposed generally in parallel to each other.

3. The plasma display device of claim 1, wherein the bracket interconnects the first main frame and the second main frame.

4. The plasma display device of claim 3, wherein the bracket comprises a first bracket and a second bracket spaced apart from each other, and wherein each of the first and second brackets is configured to interconnect the first main frame and the second main frame.

5. The plasma display device of claim 4, wherein the first and second brackets are disposed generally in parallel to each other.

6. The plasma display device of claim 4, wherein at least one of the first and second bracket is generally perpendicular to at least one of the first and second main frames.

7. The plasma display device of claim 3, wherein the bracket is farther from the PDP than the first and second main frames.

8. The plasma display device of claim 4, wherein the sub-frame is connected to i) one of the first main frame and the second main frame, and ii) one of the first bracket and the second bracket.

9. The plasma display device of claim 8, wherein the width of the sub-frame is less than the width of the main frame.

10. The plasma display device of claim 1, wherein the shield box comprises:
- a plate member mounted on at least one of the sub-frame and main frame; and
- a cover mounted on the plate member via a fastening member, wherein the cover is configured to cover the PBA mounted on the plate member.

11. The plasma display device of claim 10, wherein the plate member is formed of at least one of a metallic material and a material including carbon.

12. The plasma display device of claim 10, wherein the cover is physically and electrically connected to the plate member.

13. The plasma display device of claim 10, wherein the cover comprises an elastic portion formed at a location where the cover contacts the plate member.

14. The plasma display device of claim 1, wherein the shield box comprises a cover mounted on the sub-frame via a fastening member, and wherein the cover is configured to cover the PBA mounted on the sub-frame.

15. A plasma display device comprising:
- a plasma display panel (PDP) comprising first and second opposing surfaces, wherein the first surface is configured to display an image, and wherein the second surface comprises a pair of longer sides and a pair of shorter sides;
- first and second main frames respectively mounted on the pair of longer sides of the second surface of the PDP;
- first and second brackets spaced apart from each other, wherein each of the first and second brackets is configured to interconnect the first main frame and the second main frame;
- a sub-frame mounted to at least two of the first main frame, the second main frame, the first bracket, and the second bracket;
- a shield box mounted on at least two of the first main frame, the second main frame, and the sub-frame; and
- a printed circuit board assembly at least partially covered by the shield box.

16. The plasma display device of claim 15, wherein the shield box comprises:
- a plate member mounted to at least two of the first main frame, the second main frame, and the sub-frame; and
- a cover mounted on the plate member and configured to at least partially cover the printed circuit board assembly in conjunction with the plate member.

17. A plasma display device comprising:
a plasma display panel (PDP); and
a chassis base configured to support the PDP, wherein the chassis base comprises:
- a plurality of main components spaced apart from each other and each main component mounted to a different portion of the PDP, respectively; and
- a connection structure interconnecting the plurality of main components so as to provide a support for the PDP, wherein the connection structure comprises:
a bracket configured to interconnect at least two of the plurality of main components; and
a sub-component mounted on at least one of the main components, the bracket, and the PDP, wherein the width of the sub-component is less than that of at least one of the plurality of main components.

18. The plasma display device of claim 17, wherein the plurality of main components comprise two components which are mounted on the PDP and generally parallel to each other.

* * * * *